(12) United States Patent
Yamamoto et al.

(10) Patent No.: US 9,379,178 B2
(45) Date of Patent: Jun. 28, 2016

(54) MANUFACTURING METHOD OF SEMICONDUCTOR DEVICE COMPRISING A CAPACITOR ELEMENT

(71) Applicant: Renesas Electronics Corporation, Kawasaki-shi (JP)

(72) Inventors: Youichi Yamamoto, Kawasaki (JP); Naomi Fukumaki, Kawasaki (JP); Misato Sakamoto, Kawasaki (JP); Yoshitake Kato, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/836,152

(22) Filed: Aug. 26, 2015

(65) Prior Publication Data
US 2015/0372074 A1 Dec. 24, 2015

Related U.S. Application Data

(62) Division of application No. 12/929,287, filed on Jan. 12, 2011, now Pat. No. 9,142,609.

(30) Foreign Application Priority Data

Jan. 14, 2010 (JP) ................................. 2010-005780

(51) Int. Cl.
*H01L 21/283* (2006.01)
*H01L 21/441* (2006.01)
(Continued)

(52) U.S. Cl.
CPC .......... *H01L 28/60* (2013.01); *H01L 21/28088* (2013.01); *H01L 21/28568* (2013.01);
(Continued)

(58) Field of Classification Search
CPC ....... H01L 28/40; H01L 28/60; H01L 29/517; H01L 21/28088; H01L 21/76856
See application file for complete search history.

(56) References Cited

U.S. PATENT DOCUMENTS

| 4,839,245 A | 6/1989 | Sue et al. |
| 4,895,765 A | 1/1990 | Sue et al. |

(Continued)

FOREIGN PATENT DOCUMENTS

| CN | 1571124 A | 1/2005 |
| EP | 0 582 605 B1 | 7/1999 |

(Continued)

OTHER PUBLICATIONS

Notification of Reasons for Refusal dated Nov. 26, 2013 with English translation.

(Continued)

*Primary Examiner* — Dale E Page
*Assistant Examiner* — Paul Budd
(74) *Attorney, Agent, or Firm* — McGinn IP Law Group, PLLC (57) ABSTRACT

A method for manufacturing a semiconductor device includes a capacitor element in which a capacitance dielectric film is provided between an upper electrode film and a lower electrode film, includes forming the lower electrode film over the semiconductor substrate, forming the capacitance dielectric film over the lower electrode film, and forming the upper electrode film over the capacitance dielectric film, wherein, an entire surface layer of the lower electrode film is formed of a polycrystalline titanium nitride. At the portion of the capacitance dielectric film where directly contacting the entire surface layer of the lower electrode is formed of a polycrystalline metal oxide, and the polycrystalline metal oxide is formed by an ALD method and inherits a crystallinity of the polycrystalline titanium nitride.

6 Claims, 5 Drawing Sheets

(51) Int. Cl.
*H01L 21/8232* (2006.01)
*H01L 49/02* (2006.01)
*H01L 21/28* (2006.01)
*H01L 29/51* (2006.01)
*H01L 21/31* (2006.01)
*H01L 27/108* (2006.01)
*H01L 21/285* (2006.01)
*H01L 21/768* (2006.01)

(52) U.S. Cl.
CPC ............ *H01L21/31* (2013.01); *H01L 27/1085* (2013.01); *H01L 29/517* (2013.01); *H01L 21/28562* (2013.01); *H01L 21/76856* (2013.01); *H01L 28/91* (2013.01)

(56) References Cited

U.S. PATENT DOCUMENTS

| | | | |
|---|---|---|---|
| 5,178,911 A | 1/1993 | Gordon et al. | |
| 5,920,122 A | 7/1999 | Matsumoto et al. | |
| 5,965,942 A | 10/1999 | Itoh et al. | |
| 6,300,215 B1 | 10/2001 | Shin | |
| 6,433,380 B2 | 8/2002 | Shin | |
| 7,728,376 B2 | 6/2010 | Matsui et al. | |
| 7,834,419 B2 | 11/2010 | Ohtsuka et al. | |
| 8,368,175 B2 | 2/2013 | Nakagawa et al. | |
| 2002/0000598 A1* | 1/2002 | Kang | C23C 16/34 257/301 |
| 2003/0189225 A1 | 10/2003 | Agarwal | |
| 2004/0051132 A1* | 3/2004 | Li | H01L 21/31604 257/310 |
| 2004/0145855 A1 | 7/2004 | Block et al. | |
| 2004/0191426 A1 | 9/2004 | Kumagai et al. | |
| 2005/0104112 A1 | 5/2005 | Haukka et al. | |
| 2006/0124983 A1 | 6/2006 | Kutsunai et al. | |
| 2007/0045856 A1 | 3/2007 | Vaartstra et al. | |
| 2007/0117335 A1 | 5/2007 | Sandhu et al. | |
| 2007/0131997 A1 | 6/2007 | Ohtsuka et al. | |
| 2009/0309187 A1* | 12/2009 | Choi | H01L 27/10852 257/532 |

FOREIGN PATENT DOCUMENTS

| | | |
|---|---|---|
| JP | H06-509682 A | 10/1994 |
| JP | 08-170168 A | 7/1996 |
| JP | 2004-47633 A | 2/2004 |
| JP | 2004-277772 A | 10/2004 |
| JP | 2005-243921 A | 9/2005 |
| JP | 2007-158222 A | 6/2007 |
| JP | 2007-266474 A | 10/2007 |
| JP | 2007-329286 A | 12/2007 |
| JP | 2007-329496 A | 12/2007 |
| WO | WO 87/02071 A1 | 4/1987 |
| WO | WO 2004/008518 A1 | 1/2004 |
| WO | WO 2009/119803 A1 | 10/2009 |

OTHER PUBLICATIONS

Taiwan Office Action dated May 25, 2015, with an English translation.

Japanese Office Action dated Apr. 1, 2014, with an English translation.

Chinese Notification of First Office Action dated Oct. 30, 2013, with an English translation.

Japanese Office Action dated Aug. 4, 2015 with an English translation.

Exhibit A: S.M. Size, Physics of Semiconductor Devices, 1981, John Wiley and Sons, pp. 366-371.

* cited by examiner

MANUFACTURING METHOD OF SEMICONDUCTOR DEVICE COMPRISING A CAPACITOR ELEMENT

REFERENCE TO RELATED APPLICATION

This application is a Divisional Application of U.S. patent application Ser. No. 12/929,287, which was filed on Jan. 12, 2011, and the disclosure of which is incorporated herein in its entirety by reference thereto.

CROSS-REFERENCE TO RELATED APPLICATIONS

The disclosure of Japanese Patent Application No. 2010-5780 filed on Jan. 14, 2010 including the specification, drawings and abstract is incorporated herein by reference in its entirety.

BACKGROUND

1. Field of the Invention

The present invention concerns a semiconductor device and a manufacturing method of the semiconductor device.

2. Description of Related Art

Along with scaling down of semiconductors in recent years, it has been demanded to increase the capacitor capacitance per unit area. One of methods for increasing the capacitor capacitance is to decrease the thickness of a capacitance dielectric film. However, even when the thickness of the capacitance dielectric film is decreased, the entire capacitor capacitance is not increased but sometimes decreased rather.

For example, Japanese Unexamined Patent Publication No. 2007-329496 describes that a thin silicon oxide film present between the upper portion of a lower electrode and a capacitance film comprising $Ta_2O_5$ acts as a parasitic capacitance to lower the entire dielectric constant thereby decreasing the capacitor capacitance upon forming the thin capacitance film. The technical means for solving such a problem is as described below. According to the patent document described above, after forming $Ta_2O_5$ over a TiN lower electrode, a heat treatment at 700 to 900° C. is performed to convert a portion of TiN into $TiO_2$ at high dielectric constant. According to the method, (i) the capacitance film can be formed to a $Ta_2O_5/TiO_2$ stacked structure at high dielectric constant. The heat treatment (ii) improves the film quality of $Ta_2O_5$. Further, since this adopts a structure of providing $TiO_2$ of the capacitance film by way of a lower electrode comprising TiN over a polysilicon accumulation node, and (iii) even when the polysilicon accumulation node is oxidized, the silicon oxide film can be suppressed from acting as a parasitic capacitance. It is described that lowering of the capacitor capacitance upon decreasing the thickness of a capacitance film can be prevented due to (i) to (iii).

Further, Japanese Unexamined Patent Publication No. 2004-047633 describes a technique of forming a capacitance film over an Ru film (lower electrode) subjected to a preliminary heating treatment, thereby suppressing crackings in the capacitance film. That is, according to the patent document described above, crystal grains of the Ru film grow crystallographically into a stable state by the preliminary heat treatment. This suppresses further crystal growing of crystal grains of the Ru film upon heat treatment during formation of the capacitance film. It is described that crackings in the capacitance film due to crystal growing of the Ru film can be suppressed during formation of the capacitance film.

Further, Japanese Unexamined Patent Publication No. 2007-158222 describes that a capacitance film is formed over a lower electrode (TiN) in an amorphous state to make the capacitance film into an amorphous state thereby capable of decreasing the leak current of the capacitance film.

Further, Japanese Unexamined Patent Publication No. 2007-329286 describes that a semiconductor device satisfying higher capacitance and lower leak current simultaneously is provided by using an amorphous capacitance film (hafnium oxide film) with no addition of AlO. This patent document describes that a lower electrode of TiN is nitrided by remote plasma. The remote plasma processing intends to remove an oxide layer formed in the lower electrode forming step, thereby preventing lowering of the capacitor capacitance caused by the oxide layer of low dielectric coefficient that acts as a parasitic capacitance.

SUMMARY

In the techniques described in the patent documents above, when the capacitance dielectric film is deposited over the amorphous of the lower electrode film, the capacitance dielectric film sometimes inherits the crystallinity of the amorphous just below and becomes amorphous. However, it has been found according to the study of present inventors that since the amorphous layer of the capacitance dielectric film that inherits the amorphous state of the lower electrode film has a low dielectric constant, the entire capacitor capacitance is lowered. Further, while the capacitor capacitance is expected to be increased when the thickness of the capacitance dielectric film is decreased, the capacitor capacitance is sometimes lowered when the layer below the capacitance dielectric film is amorphous.

According to an aspect of the present invention, there is provided a semiconductor device having a capacitor element in which a capacitance dielectric film is provided between an upper electrode film and a lower electrode film, and the lower electrode film has a polycrystalline titanium nitride at least at a portion in contact with the capacitance dielectric film.

According to another aspect of the present invention, there is provided a method of manufacturing a semiconductor device of forming a capacitor element in which a capacitance dielectric film is disposed between an upper electrode film and a lower electrode film, and the method includes:

forming an interlayer insulating film over a substrate, forming a concave portion in the interlayer insulating film by selective removal, forming the lower electrode film over the bottom and over the side wall of the concave portion, and forming the capacitance dielectric film and the upper electrode film in this order above the lower electrode film, in which polycrystalline titanium nitride is formed at least to a portion of the lower electrode film in contact with the capacitance dielectric film in the forming the lower electrode film.

In the invention, the surface layer of the lower electrode film comprises a polycrystalline titanium nitride and a capacitance dielectric film is formed over the polycrystalline titanium nitride. Accordingly, since the capacitance dielectric film inherits the crystallinity of the polycrystalline titanium nitride, the capacitance dielectric film is crystallized from a lower layer to an upper layer. Therefore, according to the invention, the entire capacitor capacitance is increased compared with a capacitance dielectric film in which the lower layer is amorphous. Further, while it is expected that the capacitor capacitance is to be increased when the thickness of the capacitance dielectric film is decreased, the capacitor capacitance is decreased when the lower layer of the capacitance dielectric film is amorphous. On the contrary, in the present invention, since the lower layer of the capacitance dielectric film comprises the polycrystal of high dielectric constant, the entire capacitor capacitance is not decreased but increased.

The present invention provides a semiconductor device capable of suppressing lowering of the capacitor capacitance.

BRIEF DESCRIPTION OF THE DRAWINGS

FIGS. 1A to 1C are cross sectional views showing steps of manufacturing procedures of a semiconductor device in an embodiment of the present invention in which, FIG. 1A is a cross sectional view of showing a step of manufacturing procedures of the semiconductor device in the embodiment of the present invention;

FIGS. 2A to 2C are cross sectional vies showing steps of manufacturing procedures of a semiconductor device in an embodiment of the present invention in which

DETAILED DESCRIPTION OF THE PREFERRED EMBODIMENTS

Preferred embodiments of the present invention are to be described with reference to the drawings. Throughout the drawings, identical constitutional elements carry same reference numerals for which descriptions are to be omitted optionally.

First Embodiment

FIGS. 1A to 1C and FIGS. 2A to 2C show cross sectional views for the steps of manufacturing procedures of a semiconductor device in this embodiment.

Description is to be made to a case where a semiconductor device uses an MIM (Metal-Insulator-Metal) structure for the structure of a DRAM capacitor.

A method of manufacturing a semiconductor device of this embodiment forms a capacitor element in which a capacitance dielectric film 112 is disposed between an upper electrode film (upper electrode film 114, upper electrode film 116) and a lower electrode film 110. The method of manufacturing the semiconductor device includes a step of forming an interlayer insulating film 106 over a substrate (silicon substrate 100), a step of providing a concave portion 108 in the interlayer insulating film 106 by selective removal, a step of forming a lower electrode film 110 over the bottom and over the side wall of the concave portion 108, and a step of forming a capacitance dielectric film 112 and an upper electrode film (upper electrode film 114, upper electrode film 116) in this order above the lower electrode film 110, in which polycrystalline titanium nitride is formed at least to a portion of the lower electrode film 110 in contact with the capacitance dielectric film 112.

In this embodiment, the surface layer of the lower electrode film 110 comprises a polycrystalline titanium nitride and a capacitance dielectric film 112 is formed over the polycrystalline titanium nitride. Accordingly, since the capacitance dielectric film 112 inherits the crystallinity of the polycrystalline titanium nitride, the capacitance dielectric film 112 is crystallized from the lower layer to the upper layer. Therefore, in this embodiment, the entire capacitor capacitance is increased compared with a capacitance dielectric film where the lower layer is amorphous.

Further, while the capacitor capacitance is expected to be increased when the thickness of the capacitance dielectric film is decreased, the capacitor capacitance is decreased when the lower layer of the capacitance dielectric film is amorphous. On the other hand, in this embodiment, since the lower layer of the capacitance dielectric film 112 comprises polycrystals at high dielectric constant, the entire capacitor capacitance is not decreased but increased.

Then, a method of manufacturing a semiconductor device of this embodiment is to be described.

At first, an insulating film 102 (first interlayer insulating film) is formed over a semiconductor substrate (silicon substrate 100). Then, a contact hole is formed in the insulating film 102. A contact 104 is formed by burying a metal film in the contact and conducting a planarizing treatment. In this case, a semiconductor device such as a not illustrated transistor is provided to the silicon substrate 100. The contact 104 is connected to a diffusion layer of the transistor. As the contact 104, tungsten (W) is used for instance.

Figure 1A:
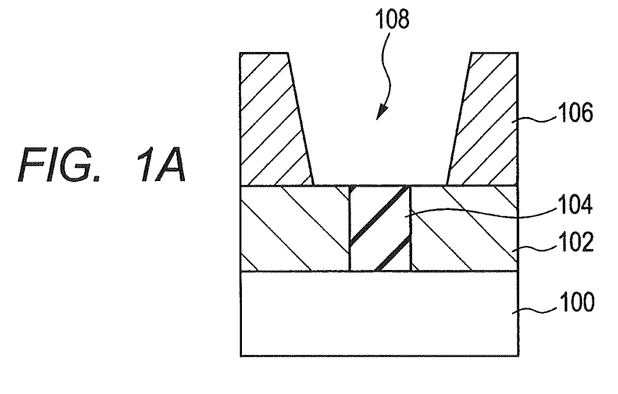

Successively, as shown in FIG. 1A, an interlayer insulating film 106 (second interlayer insulating film) is formed over the dielectric film 102. Then, the interlayer insulating film 106 is removed selectively to form a concave portion 108 (hole) in the interlayer insulating film 106. The removing method includes, for example, dry etching by using a resist pattern as a mask.

The interlayer insulating film 106 may be any film so long as it is an insulating film such as a silicon oxide film and may be either a single layer or a multilayer. Further, for the interlayer insulating film 106, a porous insulating film having a lower specific dielectric constant than that of a silicon oxide film (specific dielectric constant: 4.5) is used. The porous insulating film includes, for example, a porous silica material lowered for the specific dielectric constant by making the silicon oxide film porous, an HSQ (Hydrogen Silsesquioxane) film, or materials formed by making SiOCH, SiOC (for example, Black Diamond™, Aurora™,) etc. into a porous state, thereby lowering the specific dielectric constant. Further, also for the interlayer insulating film 102, the same materials as those for the interlayer insulating film 106 may be used.

The planar shape of the concave portion 108 is made circular. On the other hand, the cross sectional shape of the concave portion 108 is made tapered, that is, trapezoidal. As described above, a concave portion 108 of a cylindrical shape is formed. A contact 104 is disposed at the bottom of the concave portion 108. For the interlayer insulating film 106, $SiO_2$ is used for instance. Further, the thickness of the interlayer insulating film 106 is, for example, 300 nm to 1 μm.

Figure 1B:
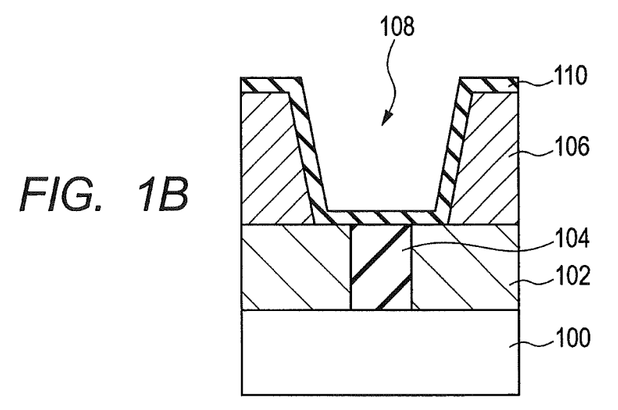
FIG. 1B is a cross sectional view of showing a step of manufacturing procedures of the semiconductor device in the embodiment of the present invention succeeding to FIG. 1A.

Successively, as shown in FIG. 1B, a lower electrode film 110 is deposited over the interlayer insulating film 106 so as to fill at least the bottom of the concave portion 108 (so as to be in contact with the contact 104). In this embodiment, the lower electrode film 110 is deposited over the bottom, over the side wall, and over the surface layer of the interlayer insulating film 106 of the concave portion 108. The thickness of the lower electrode film 110 is, for example, 3 nm to 20 nm.

A deposition step for the lower electrode film 110 in this embodiment is to be described specifically.

In the film deposition step for the lower electrode film 110, a deposition treatment of forming the lower electrode film 110, for example, over the interlayer insulating film 106 is performed. After the film deposition treatment, the lower electrode film 110 is subjected to crystallization along with the nitridation. By the treatment, a lower electrode film 110 in which at least the surface layer comprises polycrystalline titanium nitride is deposited.

For example, the nitridation includes a step of bringing nitrogen radicals into contact with the lower electrode film 110.

In this embodiment, a series of steps of film deposition and the nitridation for the lower electrode film 110 are performed, for example, in a remote plasma ALD apparatus.

The remote plasma ALD apparatus has a gas introduction port and a plasma generation chamber (remote plasma unit) at places different from a processing chamber (deposition chamber) in which a substrate is disposed. The remote plasma ALD apparatus previously plasmatizes $N_2$ by the remote plasma unit at the upstream of the film deposition chamber. When $N_2$ is plasmatized, a radical ingredient not having anisotropy (N*) is generated in a great amount. In the plasma ALD apparatus, a radical ingredient is introduced from the plasma generation chamber by way of a quartz tube to the processing chamber where the substrate is disposed. Then, a treatment for the substrate surface is performed in the processing chamber by using the radical ingredient.

As described above, the radical ingredient not having the anisotropy (N*) can be brought into contact equally to the lower electrode film 110 over the side wall together with to the bottom of the concave portion 108 in a cylindrical structure by using the remote plasma ALD apparatus for the deposition of the lower electrode film 110. That is, (i) the radial ingredient is bought into contact equally in the direction of the surface of the lower electrode film 110 over the bottom, (ii) the radial ingredient is brought into contact equally in the direction of the surface of the lower electrode film 110 over the side wall, and (iii) the radical ingredient is brought into contact equally to the lower electrode film 110 over the bottom and to the lower electrode film 110 over the side wall.

Thus, the surface of the lower electrode film 110 over the side wall and the surface layer of the lower electrode film 110 over the bottom can be nitrided equally. In this embodiment, the nitrogen content of the polycrystalline titanium nitride can be 40 or more (atomic %).

Further, by using the remote plasma ALK apparatus, the entire surface layer of the lower electrode film 110 or at least the vicinity of the surface layer thereof in a predetermined region to be in contact with the capacitance dielectric film can be crystallized.

As the starting material for the lower electrode film 110, TDMAT (Tetrakis-Dimethylamino-Titanium) is used. For example, TDMAT is supplied as the starting material into the chamber of the remote plasma ALD apparatus to deposit a thermal decomposition product of TDMAT over the substrate. Then, as described above, the $N_2$ gas is plasmatized by remote plasmas and N radicals are irradiated over the substrate. Then, a series of step cycles such as supply of the starting material and irradiation of the N radicals are repeated for plural times till a desired film thickness is obtained. The thus deposited titanium nitride is crystallized into a polycrystal.

The plasma conditions are, for example, at a temperature of 340° C. to 370° C., a plasma power of 3 KW to 5 KW, and an $N_2$ flow rate of 1 L/min to 5 L/min.

As described above, a lower electrode film 110 having the polycrystalline titanium nitride formed near the surface layer is deposited. That is, a film quality can be made substantially identical in the vicinity of the surface layer of the lower electrode film 110 over the bottom and in the vicinity of the surface layer of the lower electrode film 110 over the side wall. The film quality can be expressed by the extent of the nitrogen content or the property of the polycrystals such as the crystal face or the average crystal grain diameter.

Figure 1C:
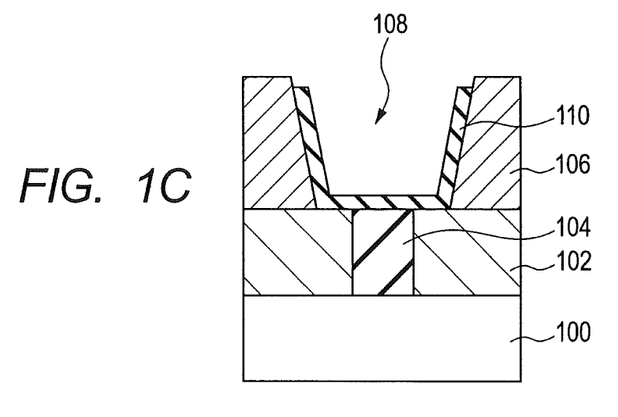
FIG. 1C is a cross sectional view showing a step of manufacturing procedures of the semiconductor device in the embodiment of the present invention succeeding to FIG. 1B.

Successively, as shown in FIG. 1C, the lower electrode film 110 is fabricated into a desired shape. In the fabrication, exposure, development, etching, and asking are performed, for instance. Thus, the lower electrode film 110 over the surface of the interlayer insulating film 106 is removed and left only at the inside of the concave portion 108. The lower electrode film 110 after fabrication is disposed so as to cover from the bottom of the concave portion 108 to the vicinity of the upper end of the side wall portion.

Figure 2A:
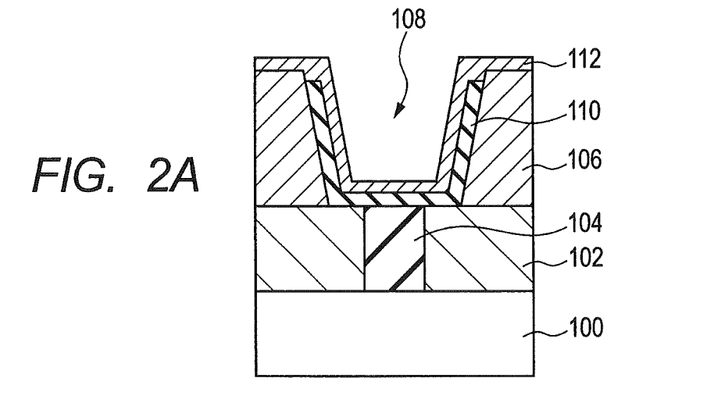
FIG. 2A is a cross sectional view showing a step of manufacturing procedures of the semiconductor device in the embodiment of the present invention.

Successively, as shown in FIG. 2A, a capacitance dielectric film 112 is deposited over the lower electrode film 110 after fabrication. That is, the vicinity of the surface layer of the lower electrode film 110 over the bottom and the vicinity of the surface layer of the lower electrode film 110 over the side wall have the same extent of film quality, and a capacitance dielectric film 112 is grown over the surface layer of the lower electrode film 110. The ALD method is used for the film deposition method. As the capacitance dielectric film 112, $ZrO_2$ is used. Further, the thickness of the capacitance dielectric film 112 is, for example, from 5 nm to 12 nm. In a case of increasing the capacitor capacitance particularly higher, the film thickness of the capacitance dielectric film 112 is made to 8 nm or less. In this case, a heat treatment is applied to the substrate. The temperature for the heat treatment is, for example, 300° C. to 450° C.

In the structure of the lower electrode film 110 in the direction of the film thickness, it may suffice that the polycrystalline titanium nitride is present at least near the surface layer. That is, in the structure of the lower electrode film 110 in the direction of the film thickness, the polycrystalline titanium nitride may be provided entirely, or layers of polycrystals and those in other states (for example, amorphous) may be disposed alternately. In this case, the polycrystalline titanium nitride may suffice to satisfy the property of the polycrystals described above and the range of the property may vary within a predetermined extent or the range of the property may be substantially identical. The lower electrode film 110 may be a single layer or a multilayer structure, for example, comprising Ti and TiN.

Successively, the structure in the lower electrode film 110 in the direction of the surface in contact with the capacitance dielectric film 112 is to be described. As has been described above, the extent of the film quality is substantially identical in the vicinity of the surface layer of the lower electrode film 110 over the bottom and in the vicinity of the surface layer of the lower electrode film 110 over the side wall. That is, the lower electrode film 110 is equally nitrided and crystallized as viewed in the direction of the surface of the lower electrode film 110 over the bottom and the lower electrode film 110 over the side wall.

When the lower electrode film 110 is nitrided equally, the nitrogen content in the direction of the surface of the lower electrode film 110 is 40 or more (atomic %).

Further, when the lower electrode 110 is crystallized equally, for example, the main surface of the crystal face in the direction of the surface of the lower electrode film 110 is identical.

Figure 2B:
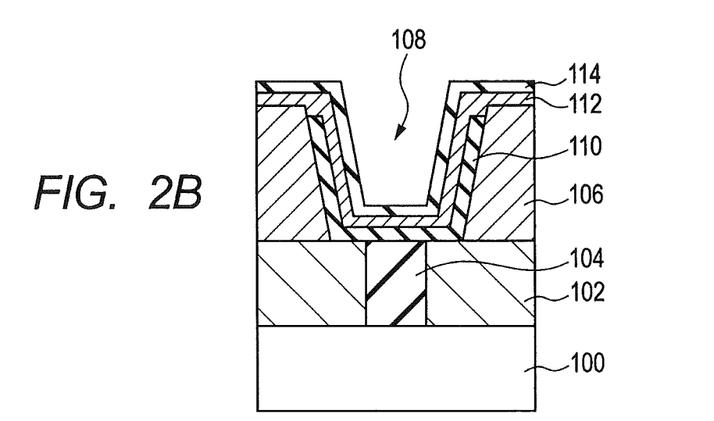
FIG. 2B is a cross sectional view showing a step of manufacturing procedures of the semiconductor device in the embodiment of the present invention succeeding to FIG. 2A.
Figure 2C:
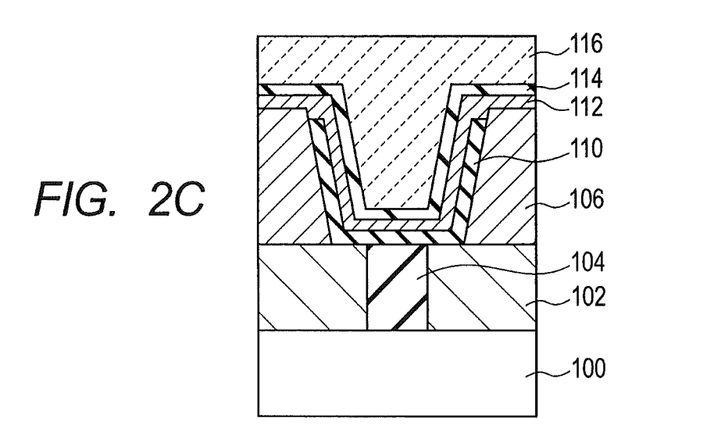
FIG. 2C is a cross sectional view showing a step of manufacturing procedures of the semiconductor device in the embodiment of the present invention succeeding to FIG. 2B.

Subsequently, as shown in FIGS. 2B and 2C, an upper electrode film 114 and an upper electrode film 116 are deposited over the capacitance dielectric film 112, for example, by CVD. Titanium nitride is used for the upper electrode film 114 and tungsten is used for the upper electrode film 116. A not illustrated third interlayer insulating film is disposed over the upper electrode films 114 and 116.

By the procedures described above, a semiconductor device having a DRAM capacitor of an MIM structure can be obtained.

Then, a semiconductor device of this embodiment is to be described.

The semiconductor device of this embodiment has a capacitor element in which a capacitance dielectric film 112 is disposed between an upper electrode film (upper electrode film 114, an upper electrode film 116) and a lower electrode film 110. The lower electrode film 110 has a polycrystalline titanium nitride at least to a portion in contact with the capacitance dielectric film 112.

In this embodiment, the polycrystalline titanium nitride can be, for example, a polycrystal comprising crystallite.

The polycrystalline structure in this embodiment can be expressed by the following characteristic.
(1) Crystal Face is Present.

The characteristic (1) can be measured by In-plane XRD.

Figure 3:
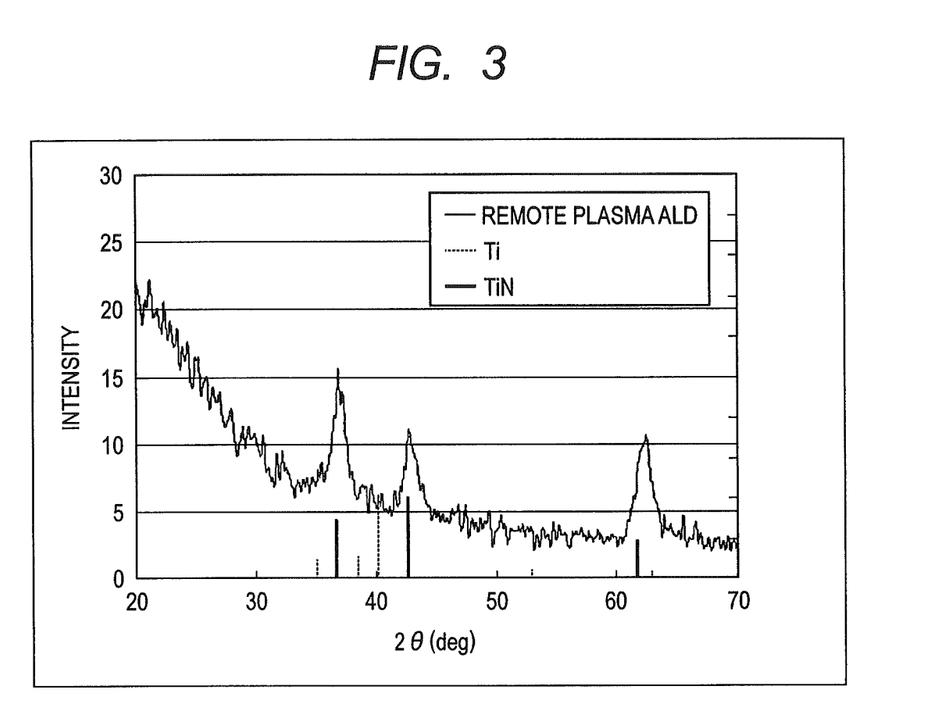
FIG. 3 is a graph showing in-plane XRD diffraction peaks of a lower electrode TiN used in the embodiment.

FIG. 3 shows diffraction peaks of In-plane XRD performed to an example in which the lower electrode used in this embodiment comprises TiN.

As shown in FIG. 3, TiN crystallinity was investigated by In-plane XRD. As a result, for the crystal face (1), diffraction peaks at (111), (220), and (200) were observed for TiN. From the result, it was confirmed that TiN obtained in the remote plasma ALD apparatus according to this embodiment is crystallized. Further, it was found that the crystal face of the polycrystalline titanium nitride has a (200) face as the main face. Further, the crystal face of the polycrystalline titanium nitride may have any one of (111), (200), and (220) faces and may have the (220) face as the main face.

For the polycrystalline titanium nitride at the surface layer of the lower electrode film 110, the amount of the nitrogen was measured by XPS. It was found that the nitrogen content of the polycrystalline titanium nitride was 40 or more and 50 or less (atomic %).

The capacitance dielectric film 112 grown over the lower electrode film 110 as described above tends to inherit the crystal information of the lower electrode film 110 just therebelow. Therefore, it was found by the inventors' study that the initial film (capacitance dielectric film 112 for the lower layer portion) the capacitance dielectric film 112 is grown by crystallization. $ZrO_2$ at high dielectric constant can be used, for example, for the crystallized capacitance dielectric film 112. In $ZrO_2$, the dielectric constant is 36.8 for the cubic structure and 46.6 for the tetragonal structure.

Further, in the capacitance dielectric film 112 in this embodiment, a metal oxide of high dielectric constant can be used. The metal oxide includes $ZrO_2$, as well as $HfO_2$ and $Ta_2O_2$ or those having other elements added to them. Other elements include, for example, Ti, Al, and Y, and lanthanoides such as La and Er. Polycrystals of such metal oxides tend to inherit the crystallinity of the polycrystalline titanium nitride situated just therebelow. The capacitance dielectric film 112 may have a single layer or multilayer structure of a polycrystalline metal oxide.

Then, description is to be made to the function and the effect of this embodiment.

In this embodiment, the surface layer of the lower electrode film 110 comprises an amorphous titanium nitride and a capacitance dielectric film 112 is formed over the polycrystalline titanium nitride. Accordingly, in the process of forming the capacitance dielectric film 112, the lower layer of the capacitance dielectric film 112 inherits the crystallinity of the polycrystalline titanium nitride situated just therebelow. As a result, the capacitance dielectric film 112 is crystallized from the lower layer to the upper layer. Therefore, in this embodiment, the entire capacitor capacitance is increased compared with the case of the capacitance dielectric film in which the lower layer is in the amorphous state.

The capacitor capacitance is theoretically represented by the general formula: $C=(\in/d) \times S$ in which C is a capacitor capacitance, $\in$ is a dielectric constant of a capacitance dielectric film, d is a thickness of the capacitance dielectric film, and S is an electrode area.

According to the general formula, the capacitor capacitance increases as the thickness of the capacitance dielectric film is decreased. However, when the lower layer of the capacitance dielectric film is an amorphous, since the amorphous has a lower dielectric constant than that of the crystal, the entire capacitor capacitance is not increased but decreased.

On the contrary, in this embodiment, even when the thickness of the capacitance dielectric film 112 is decreased such that the thickness of the capacitance dielectric film 112 is, for example, 8 nm or less, since the lower layer of the capacitance dielectric film 112 comprises polycrystals of high dielectric constant, the entire capacitor capacitance is not decreased but increased.

This is to be described specifically with reference to FIGS. 4A, 4B and FIGS. 5A, 5B.

Figure 4A:
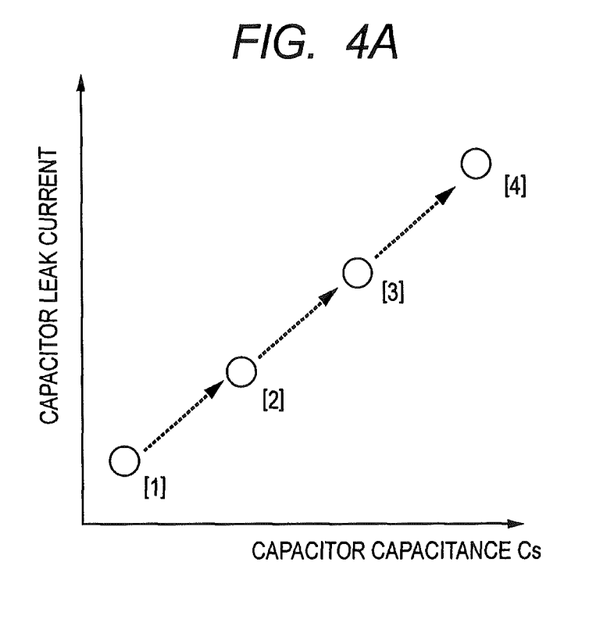
FIG. 4A is a graph showing a relation between a capacitor capacitance and a leak current of the embodiment upon decreasing the thickness of the capacitance film.
Figure 4B:
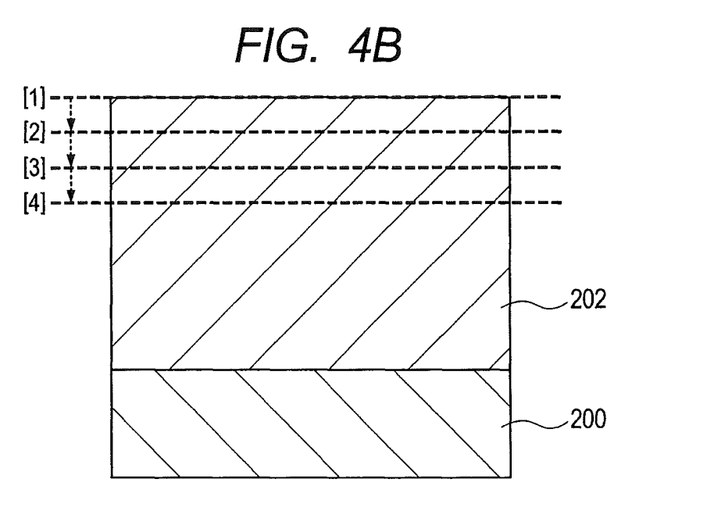
FIG. 4B is a view showing a cross sectional structure of the embodiment.
Figure 5A:
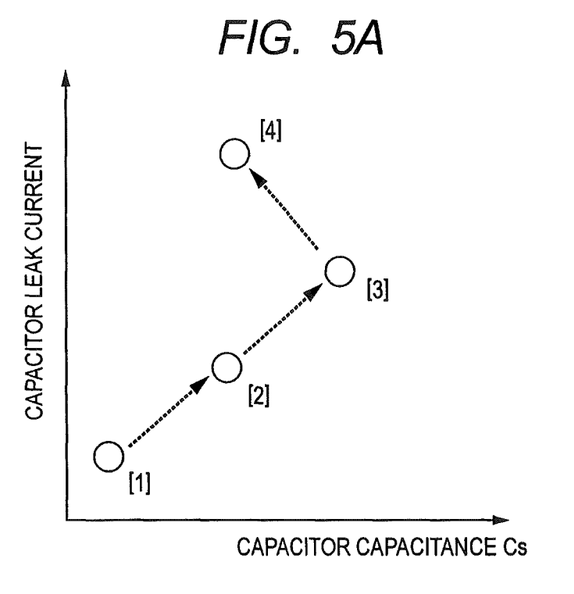
FIG. 5A is a graph showing a relation between a capacitor capacitance and a leak current of the prior art upon decreasing the thickness of the capacitance film.
Figure 5B:
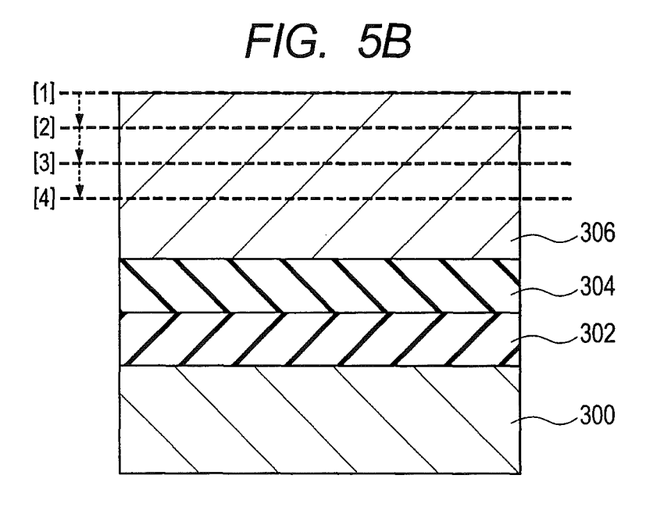
FIG. 5B is a graph showing a cross sectional structure of the prior art.

FIG. 4A shows a relation between capacitor capacitance and a leak current when the thickness of the capacitance dielectric film is decreased in this embodiment. FIG. 4B schematically shows a cross sectional structure of an MIM capacitor according to this embodiment. FIG. 5A shows a relation between a capacitor capacitance and a leak current when the thickness of the capacitance dielectric film is decreased in an example where a lower electrode film is amorphous. FIG. 5B schematically shows a cross sectional structure of an MIM capacitor according to an example in which the lower electrode film is amorphous.

In the example shown in FIG. 5A, a lower electrode film comprising an amorphous TiN 300 is used. In this case, a capacitance dielectric film comprising, for example, $ZrO_2$ has a distribution of the crystallinity from amorphous to crystal in the direction of the film thickness. That is, when a capacitance dielectric film is deposited over the amorphous of the lower electrode film, the capacitance dielectric film inherits the crystallinity of the amorphous and the capacitance dielectric film becomes amorphous in a portion in contact with the amorphous TiN 300 (lower electrode film) ($ZrO_2$ 302). On the other hand, since crystallization proceeds over the amorphous of the capacitance dielectric film when the thickness of the film is increased, crystallization proceeds to some extent at a portion slightly remote from the amorphous TiN 300 ($ZrO_2$ 304), and the capacitance dielectric film is crystallized at a further remote portion ($ZrO_2$ 306). The dielectric constant becomes lower in the amorphous portion and the dielectric constant becomes higher in the polycrystalline portion. Accordingly, as shown at [1] to [4] in FIG. 5B, when the thickness for the upper layer portion of the polycrystals of high dielectric constant ($ZrO_2$ 306) is decreased, since $ZrO_2$ 302 and $ZrO_2$ 304 of the lower layer portion are amorphous and have a low dielectric constant, the capacitance is decreased (FIG. 5A).

On the contrary in this embodiment, as shown in FIG. 4B, $ZrO_2$ 202 crystallized from the initial stage of growing (capacitance dielectric film) is grown over the lower electrode film comprising a polycrystal TiN 200. Even when the thickness of $ZrO_2$ 202 is decreased as shown at [1] to [4] in FIG. 4B, since the quality is identical in the direction of the film thickness, the dielectric constant of $ZrO_2$ 202 (capacitance dielectric film) shows a constant value. Accordingly, in a case of decreasing the thickness of the capacitance dielectric film, while the film thickness d is decreased, other properties such as dielectric constant remain constant. In accordance with the general formula described above, the capacitor capacitance C is increased in an inverse proportion to d (FIG. 4A).

As described above, in this embodiment, the entire capacitor capacitance is increased compared with that in the technique in which the lower layer has a capacitance dielectric film in an amorphous state. In addition, even when the thickness of the capacitance dielectric film is decreased, since the lower layer of the capacitance dielectric film comprises polycrystals of high dielectric constant, the entire capacitor capacitance is not decreased but increased.

In other words, in this embodiment, the crystallinity of the capacitance film can be increased to increase the capacitor capacitance by using the crystallized lower electrode in the MIM capacitor and lowering of the capacitance can be suppressed upon decreasing the thickness of the capacitance film.

Further, as described above, in the step of manufacturing the semiconductor device of this embodiment, the polycrystalline titanium nitride over the bottom and the polycrystalline titanium nitride over the side wall of the concave portion 108 of the cylindrical structure are nitrided or crystallized equally. The capacitance dielectric film 112 is disposed so as to be in contact with the polycrystalline titanium nitride (lower electrode film 110) where the film quality is identical for the portion over the bottom and that over the side wall. Accordingly, the film quality (for example, dielectric constant) is also equal between the capacitance dielectric film 112 over the bottom and the capacitance dielectric film 112 over the side wall. Since the capacitance dielectric film 112 excellent in the film deposition property is provided as described above, the dielectric constant of the capacitance dielectric film 112 can be improved. Further, in the manufacturing process of this embodiment, since the film quality can be made equal between the capacitance dielectric film 112 over the bottom and the capacitance dielectric film 112 over the side wall, variation of the deposition property for the capacitance dielectric film 112 can be suppressed. This can prevent the variation of the leak current in the capacitance dielectric film 112.

Further in the technique described in Japanese Unexamined Patent Publication 2007-329496, since the heat treatment temperature is at a relatively high temperature of 700 to 900° C., this may sometimes give an undesired effect on the structure and the property at the periphery of the gate formed before the heat treatment, particularly, in a hybrid DRAM. As a result of the inventors' study, while a heat treatment temperature up to about 500° C. is usually used for forming the nickel silicide, Ni diffusion occurs to bring about increase in a junction leak current when a thermal load of higher temperature is applied. Further, in $TiO_2$ used for the capacitance dielectric film, though the dielectric constant is high, the leak current in the capacitor may sometimes be increased.

On the other hand, in this embodiment, the crystallinity of the capacitance dielectric film 112 is improved by forming the capacitance dielectric film 112 over the crystallized lower electrode film 110 in the MIM capacitor while taking notice on the crystallinity of the capacitance film in the initial stage of the capacitance film. This can increase the capacitor capacitance without using the high temperature process and a material of large capacitor leak current such as $TiO_2$. That is, in this embodiment, a capacitance film of a high quality having a high dielectric constant can be obtained by using the crystallized lower electrode without conducting annealing for the capacitance film at high temperature.

Second Embodiment

A second embodiment is to be described with reference to FIG. 1 and FIG. 2 for the difference from the first embodiment. That is, in the first embodiment, nitridation and crystallization in the deposition of the lower electrode film 110 have been performed by using an identical apparatus. However, deposition of the lower electrode film and the nitridation and crystallization are not restricted to the process described above but can be performed by using separate apparatus in the second embodiment.

At first, in the same manner as in the first embodiment, a structure shown in FIG. 1A is provided. Successively, a lower electrode film 110 is deposited over the side wall and over the bottom of the concave portion 108 of the cylindrical structure (FIG. 1B). A parallel plate type plasma CVD is used for the deposition of the lower electrode film 110. As the starting material gas, TDMAT (tetrakis-Dimethylamino-Titanium) is used for instance.

In this step, a crystallized lower electrode film 110 is deposited over the bottom of the concave portion 108 of the cylindrical structure. On the other hand, since plasmas such as ions having anisotropy are scarcely irradiated over the side wall of the concave portion 108 of the cylindrical structure, an amorphous lower electrode film 110 is deposited (FIG. 1B).

Subsequently, the same remote plasma nitridation as in the first embodiment is performed. Amorphous TiN over the side wall of the concave portion 108 of the cylindrical structure can be crystallized along with nitridation by the radical ingredient not having the anisotropy. In this step, the crystallized lower electrode film 110 over the bottom of the concave portion 108 of the cylindrical structure can also be nitrided.

Successively, after the nitridation and the crystallization, the lower electrode film 110 is fabricated (FIG. 1C). In the fabrication, exposure, development, etching, and ashing are performed.

A semiconductor device having a DRAM capacitor of an MIM structure can be obtained in the subsequent steps shown in FIGS. 2A to 2C in the same manner as in the first embodiment. Also in the second embodiment, similar effects as those in the first embodiment can be obtained.

An oxide layer may be formed to the surface of the lower electrode film 110 by the ashing treatment during fabrication for the lower electrode film 110. On the contrary, in the second embodiment, the remote plasma nitridation can be performed after the fabrication of the lower electrode film 110 and before the deposition of the capacitance dielectric film 112. By the nitridation described above, the oxide layer can be substituted by TiN and the oxide layer that acts as the parasitic capacitance can be removed. Further, removal of the oxide layer and crystallization can be performed simultaneously. By performing the removal of the oxide layer and the crystallization in parallel, the capacitor capacitance can be improved further. Further, the effect of the second embodiment can be obtained when the lower electrode film 110 in contact with the capacitance dielectric film 112 is at least crystallized before deposition of the capacitance dielectric film 112.

Further, the lower electrode film 110 can be deposited by any other deposition method in addition to the remote plasma ALD so long as the crystallized lower electrode film 110 can be formed over the side wall and over the concave portion 108 of the cylindrical structure. The deposition method includes, for example, thermal ALD but CVD or PVD may also be used. Further, the amorphous TiN over the side wall of the concave portion 108 of the cylindrical structure may be nitrided and crystallized not by the remote plasma nitridation but by a heat treatment using $NH_3$ or the like. The temperature for the heat treatment is, for example, 350° C. to 450° C.

While the preferred embodiments of the present invention have been described above with reference to the drawings, they are typical examples of the invention and various other embodiments than those described above can also be adopted.

Further, as the material for the contact 104, a film in which Ti (upper layer)/TiN (lower layer) are laminated as a barrier metal film may, for example, be disposed to the layer below the W film.

The concave portion 108 may be in a circular columnar shape in addition to the cylindrical shape. In this case, the planar shape of the concave portion 108 is circular. On the other hand, cross sectional shape of the concave portion 108 can be formed as a square or rectangular shape.

What is claimed is:

1. A method for manufacturing a semiconductor device comprising a capacitor element in which a capacitance dielectric film is provided between an upper electrode film and a lower electrode film, comprising steps of:
   (a) forming the lower electrode film over the semiconductor substrate;
   (b) forming the capacitance dielectric film over the lower electrode film; and
   (c) forming the upper electrode film over the capacitance dielectric film,
   wherein, at the step (a), an entire surface layer of the lower electrode film is formed of a polycrystalline titanium nitride,
   wherein, at the step (b), a portion of the capacitance dielectric film where directly contacting the entire surface layer of the lower electrode is formed of a polycrystalline metal oxide, and
   wherein the polycrystalline metal oxide is formed by an ALD method and inherits a crystallinity of the polycrystalline titanium nitride.

2. The method for manufacturing a semiconductor device according to claim 1,
   wherein a nitrogen content of the polycrystalline titanium nitride is 40 atomic % or more.

3. The method for manufacturing a semiconductor device according to claim 1,
   wherein the polycrystalline metal oxide includes at least one member selected from the group consisting of $ZrO2$, $HfO2$, and $Ta2O3$.

4. The method for manufacturing a semiconductor device according to claim 3,
   wherein the polycrystalline metal oxide is added Ti, Al, Y, or a lanthanoid.

5. The method for manufacturing a semiconductor device according to claim 1,
   wherein the capacitor element constitutes a part of a DRAM.

6. The method for manufacturing a semiconductor device according to claim 1, further comprising steps of:
   (d) before the step (a), forming an interlayer insulating film over the semiconductor substrate; and
   (e) forming a concave portion in the interlayer insulating film,
   wherein the step (a) comprises:
   (a1) after the step (e), forming the lower electrode film in the concave portion and over the interlayer insulating film, and
   (a2) after the step (a1), removing the lower electrode film being outside of the concave portion, and
   wherein, at the step (a1), the entire surface layer of the lower electrode film is formed of the polycrystalline titanium nitride.

* * * * *